United States Patent
Wang et al.

(10) Patent No.: US 11,557,484 B2
(45) Date of Patent: Jan. 17, 2023

(54) CONTACT STRUCTURES WITH DEPOSITED SILICIDE LAYERS

(71) Applicant: Taiwan Semiconductor Manufacturing Co., Ltd., Hsinchu (TW)

(72) Inventors: Sung-Li Wang, Zhubei (TW); Yasutoshi Okuno, Hsinchu (TW); Shih-Chuan Chiu, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 17/329,024

(22) Filed: May 24, 2021

(65) Prior Publication Data

US 2021/0280427 A1    Sep. 9, 2021

Related U.S. Application Data

(62) Division of application No. 16/531,464, filed on Aug. 5, 2019, now Pat. No. 11,018,012.

(60) Provisional application No. 62/734,572, filed on Sep. 21, 2018.

(51) Int. Cl.
| | |
|---|---|
| *H01L 21/285* | (2006.01) |
| *H01L 21/8234* | (2006.01) |
| *H01L 29/66* | (2006.01) |
| *H01L 21/02* | (2006.01) |
| *H01L 21/8238* | (2006.01) |
| *H01L 21/768* | (2006.01) |

(Continued)

(52) U.S. Cl.
CPC .... *H01L 21/28518* (2013.01); *H01L 21/0228* (2013.01); *H01L 21/02274* (2013.01); *H01L 21/76832* (2013.01); *H01L 21/823418* (2013.01); *H01L 21/823431* (2013.01); *H01L 21/823437* (2013.01); *H01L 21/823871* (2013.01); *H01L 27/0886* (2013.01); *H01L 29/66795* (2013.01); *H01L 29/785* (2013.01)

(58) Field of Classification Search
CPC .......... H01L 21/02274; H01L 21/0228; H01L 21/0886; H01L 21/28518; H01L 21/28562; H01L 21/76832; H01L 21/76843; H01L 21/76897; H01L 21/823418; H01L 21/823431; H01L 21/823437; H01L 21/823475; H01L 21/823871; H01L 29/41791; H01L 29/66795; H01L 29/785
See application file for complete search history.

(56) References Cited

U.S. PATENT DOCUMENTS

| | | |
|---|---|---|
| 6,091,148 A | 7/2000 | Givens et al. |
| 9,093,530 B2 | 7/2015 | Huang et al. |
| 9,171,929 B2 | 10/2015 | Lee et al. |

(Continued)

*Primary Examiner* — Allan R Wilson
(74) *Attorney, Agent, or Firm* — Sterne, Kessler, Goldstein & Fox P.L.L.C.

(57) ABSTRACT

A method of forming a semiconductor device includes forming a source/drain region on a substrate, depositing a metal-rich metal silicide layer on the source/drain region, depositing a silicon-rich metal silicide layer on the metal-rich metal silicide layer, and forming a contact plug on the silicon-rich metal silicide layer. This disclosure also describes a semiconductor device including a fin structure on a substrate, a source/drain region on the fin structure, a metal-rich metal silicide layer on the source/drain region, a silicon-rich metal silicide layer on the metal-rich metal silicide layer, and a contact plug on the silicon-rich metal silicide layer.

20 Claims, 7 Drawing Sheets

(51) Int. Cl.
  *H01L 29/78*     (2006.01)
  *H01L 27/088*    (2006.01)

(56) References Cited

U.S. PATENT DOCUMENTS

| | | |
|---|---|---|
| 9,214,555 B2 | 12/2015 | Oxland et al. |
| 9,236,267 B2 | 1/2016 | De et al. |
| 9,520,482 B1 | 12/2016 | Chang et al. |
| 9,548,303 B2 | 1/2017 | Lee et al. |
| 9,564,489 B2 | 2/2017 | Yeo et al. |
| 9,576,814 B2 | 2/2017 | Wu et al. |
| 9,601,342 B2 | 3/2017 | Lee et al. |
| 9,608,116 B2 | 3/2017 | Ching et al. |
| 2014/0154856 A1 | 6/2014 | Alptekin et al. |
| 2014/0206190 A1 | 7/2014 | Li et al. |
| 2020/0098582 A1 | 3/2020 | Wang et al. |

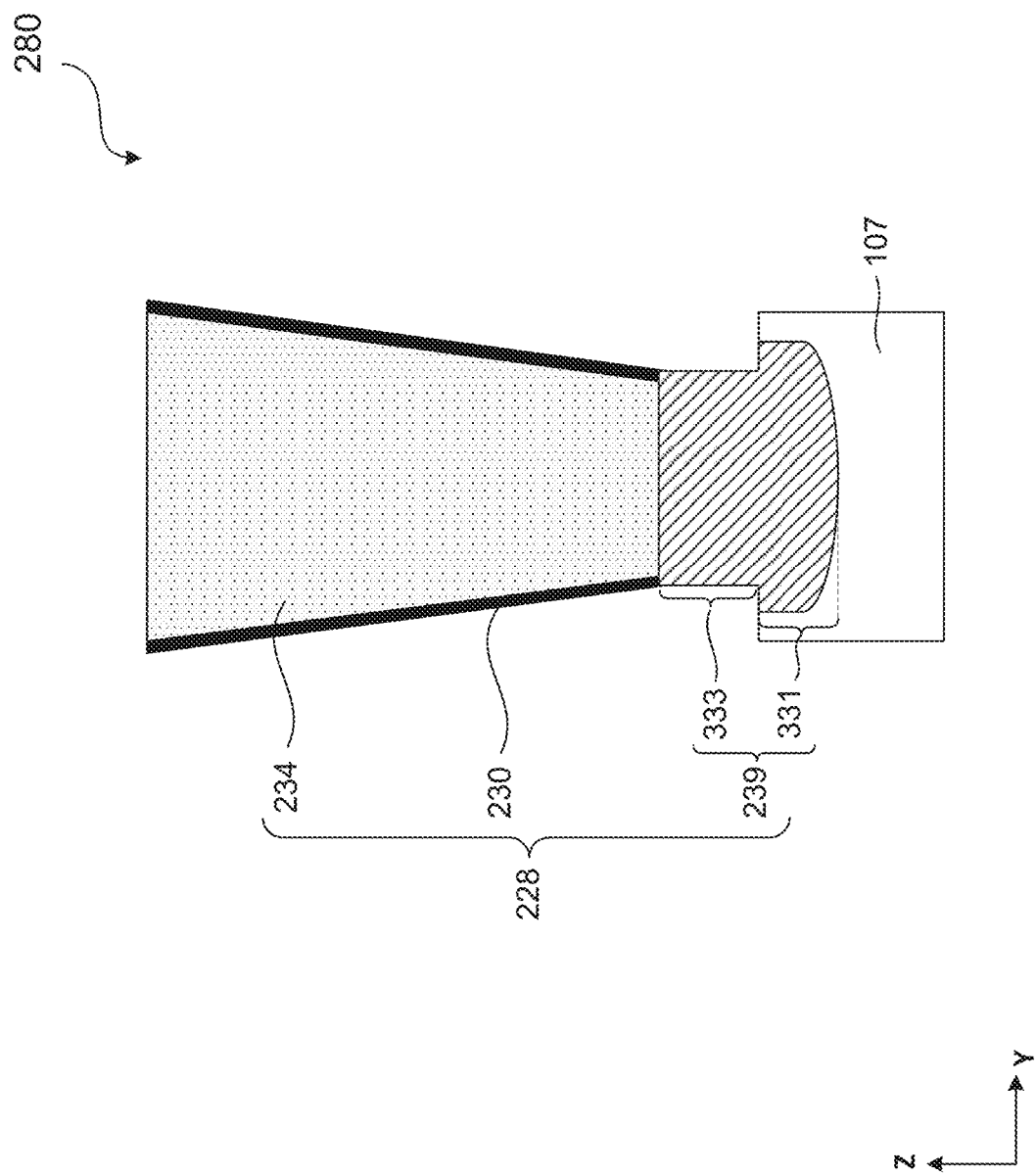

CONTACT STRUCTURES WITH DEPOSITED SILICIDE LAYERS

CROSS-REFERENCE TO RELATED APPLICATIONS

This application is a divisional of U.S. patent application Ser. No. 16/531,464, titled "Contact Structures with Deposited Silicide Layer," filed Aug. 5, 2019, which claims the benefit of U.S. Provisional Patent Application No. 62/734,572, titled "Contact with Deposited Silicide Layer," filed Sep. 21, 2018, each of which is incorporated by reference in its entirety.

BACKGROUND

The semiconductor integrated circuit (IC) industry has experienced exponential growth. Technological advances in IC materials and design have produced generations of ICs, where each generation has smaller and more complex circuits than the previous generation. In the course of IC evolution, functional density (e.g., the number of interconnected devices per chip area) has generally increased while geometry size (e.g., the smallest component or line that can be created using a fabrication process) has decreased. This scaling down process generally provides benefits by increasing production efficiency and lowering associated costs.

BRIEF DESCRIPTION OF THE DRAWINGS

Aspects of this disclosure are best understood from the following detailed description when read with the accompanying figures. It is noted that, in accordance with the common practice in the industry, various features are not drawn to scale. In fact, the dimensions of the various features can be arbitrarily increased or reduced for clarity of discussion.

FIGS. 3-4 and 5A-5B illustrate cross-sectional views of a finFET with deposited silicide layers, in accordance with some embodiments.

Illustrative embodiments will now be described with reference to the accompanying drawings. In the drawings, like reference numerals generally indicate identical, functionally similar, and/or structurally similar elements.

DETAILED DESCRIPTION

Figure 1:
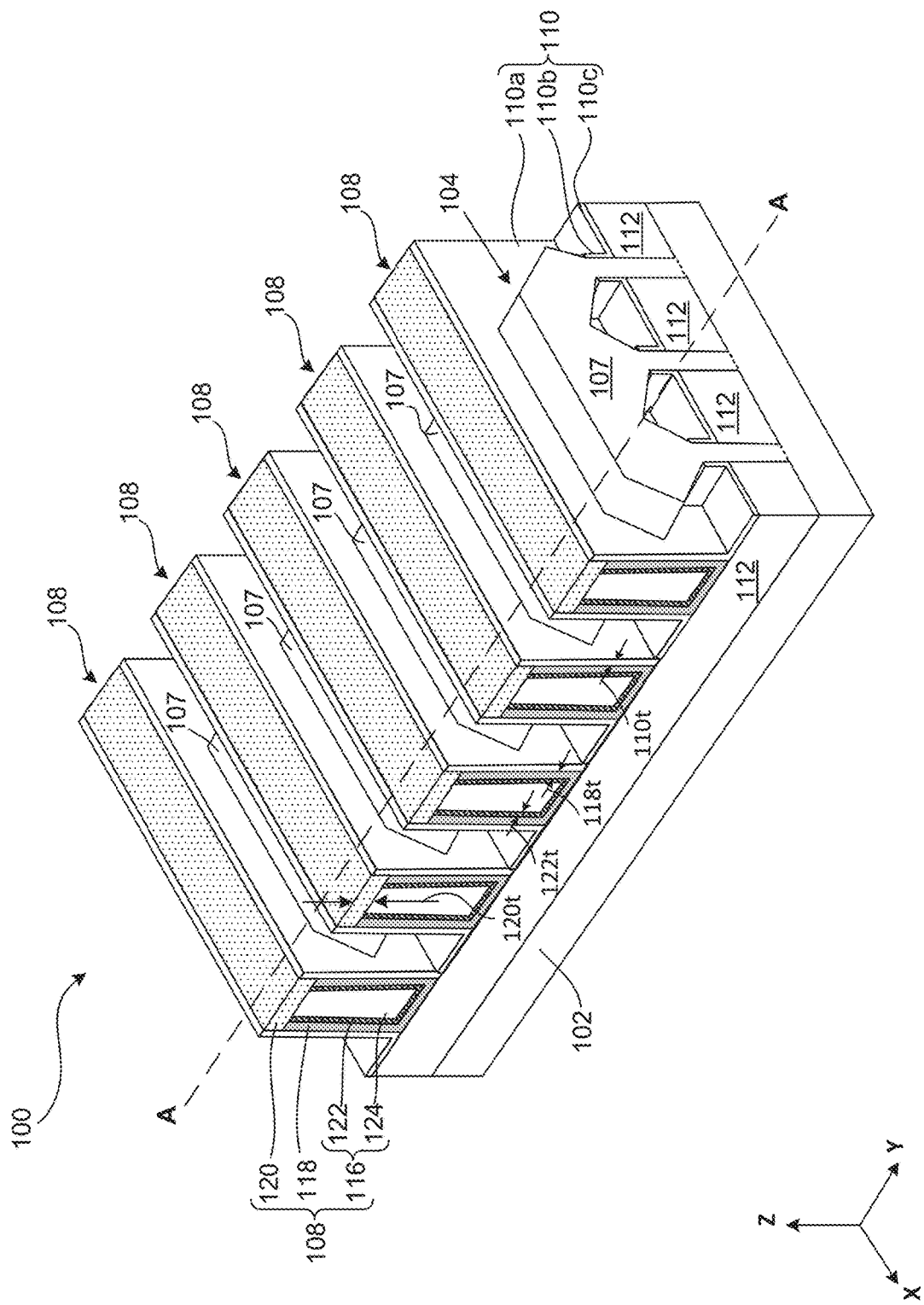
FIG. 1 illustrates an isometric view of a fin field effect transistor (finFET), in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows can include embodiments in which the first and second features are formed in direct contact, and can also include embodiments in which additional features can be formed between the first and second features, such that the first and second features cannot be in direct contact. As used herein, the formation of a first feature on a second feature means the first feature is formed in direct contact with the second feature. In addition, the present disclosure can repeat reference numerals and/or letters in the various examples. This repetition does not in itself dictate a relationship between the various embodiments and/or configurations discussed.

Spatially relative terms, such as "beneath," "below," "lower," "above," "upper," and the like, can be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus can be otherwise oriented (rotated 90 degrees or at other orientations) and the spatially relative descriptors used herein can likewise be interpreted accordingly.

It is noted that references in the specification to "one embodiment," "an embodiment," "an example embodiment," "exemplary," etc., indicate that the embodiment described can include a particular feature, structure, or characteristic, but every embodiment does not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

As used herein, the term "etch selectivity" refers to the ratio of the etch rates of two different materials under the same etching conditions.

As used herein, the term "deposition selectivity" refers to the ratio of the deposition rates on two different materials or surfaces under the same deposition conditions.

As used herein, the term "Si-rich metal silicide layer" refers to a metal silicide layer having an atomic concentration of Si greater than the atomic concentration of any other chemical element in the metal silicide layer.

As used herein, the term "metal-rich metal silicide layer" refers to a metal silicide layer having an atomic concentration of metal greater than the atomic concentration of any other chemical element in the metal silicide layer.

In some embodiments, the terms "about" and "substantially" can indicate a value of a given quantity that varies within 5% of the value (e.g., ±1%, ±2%, ±3%, ±4%, ±5% of the value).

As used herein, the term "substrate" describes a material onto which subsequent material layers are added. The substrate itself can be patterned. Materials on top of the substrate can be patterned or can remain unpatterned. Furthermore, the substrate can be a wide array of semiconductor materials, such as silicon, germanium, gallium arsenide, indium phosphide, etc. Alternatively, the substrate can be made from an electrically non-conductive material, such as a glass or a sapphire wafer.

As used herein, the term "epitaxial layer" refers to a layer or structure of single crystal material. Likewise, the expression "epitaxially grown" herein refers to a layer or structure of single crystal material. Epitaxially-grown material may be doped or undoped.

As used herein, the term "high-k" refers to a high dielectric constant. In the field of semiconductor device structures and manufacturing processes, high-k refers to a dielectric constant that is greater than the dielectric constant of silicon dioxide ($SiO_2$) (e.g., 3.9).

As used herein, the term "low-k" refers to a small dielectric constant. In the field of semiconductor device structures and manufacturing processes, low-k refers to a dielectric constant that is less than the dielectric constant of $SiO_2$ (e.g., 3.9).

As used herein, the term "p-type" defines a structure, layer, and/or region as being doped with p-type dopants, such as boron.

As used herein, the term "n-type" defines a structure, layer, and/or region as being doped with n-type dopants, such as phosphorus.

As used herein, the term "conductive lines" defines horizontal interconnect lines through interlayer dielectric (ILD) layer(s) that electrically connect various elements in a finFET and/or an integrated circuit.

As used herein, the term "conductive vias" defines vertical interconnect lines through ILD layer(s) that electrically connect various elements in a finFET and/or an integrated circuit.

As used herein, the term "vertical" means nominally perpendicular to the surface of a substrate.

As used herein, the term "critical dimension" refers to the smallest feature size (e.g., line width) of a finFET and/or an element of an integrated circuit.

The fin structures disclosed herein may be patterned by any suitable method. For example, the fin structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fin structures.

This disclosure provides various example source/drain (S/D) contact structures of finFETs and methods for making the same. The example S/D contact structures and methods can reduce contact resistance between S/D contact plugs and metal silicide layers of the S/D contact structures and/or between the metal silicide layers and S/D regions. The metal silicide layers of the example S/D contact structures can each include a metal-rich silicide layer and a Si-rich silicide layer.

In some embodiments, the metal-rich silicide layers can be disposed on the S/D regions and can reduce the contact resistance between the metal silicide layers and the S/D regions. The Si-rich silicide layers can be disposed on the metal-rich silicide layers and can reduce the Kirkendall effect during the formation of the metal silicide layers. The Kirkendall effect can create Si vacancies in the S/D regions due to the diffusion of Si from the S/D regions to the metal layers deposited for the formation of metal silicide layers. Such Si vacancies in the S/D regions can reduce the dopant concentrations in the S/D regions and as a result, increase resistivity of S/D regions. Thus, reducing the Kirkendall effect with the Si-rich silicide layers can improve the conductivity of S/D regions.

The example methods for forming the metal silicide layers provide, among other things, benefits of 1) improved phase stability of the S/D contact plugs; 2) less silicon consumption from the S/D regions during the formation of the metal silicide layers; 3) fewer processing steps for the formation of a diffusion barrier layer for the S/D contact plugs; and 4) higher deposition selectivity of the metal silicide layers to the S/D regions than to the sidewalls of the S/D contact openings, which could be the sidewalls of the interlayer dielectric (ILD) layers of the finFETs. In some embodiments, the deposition selectivity of the metal silicide layers to the S/D regions over the sidewalls of the S/D contact openings can be about 2:1 to about 10:1.

FIG. 1 is an isometric view of a fin field effect transistor (finFET) 100, according to some embodiments. FinFET 100 can be included in a microprocessor, memory cell, or other integrated circuit. The view of finFET 100 in FIG. 1 is shown for illustration purposes and may not be drawn to scale.

FinFET 100 can be formed on a substrate 102 and can include a fin structure 104 having fin regions (not shown in FIG. 1, but fin regions 221 shown in FIG. 2) and S/D regions 107, gate structures 108 disposed on corresponding one of fin regions of fin structure 104, spacers 110 disposed on opposite sides of each of gate structures 108, and shallow trench isolation (STI) regions 112. FIG. 1 shows five gate structures 108. However, based on the disclosure herein, finFET 100 can have more or less gate structures. In addition, finFET 100 can be incorporated into an integrated circuit through the use of other structural components—such as S/D contact structures (shown in FIG. 2), gate contact structures (shown in FIG. 2), conductive vias, conductive lines, dielectric layers, and passivation layers—that are not shown in FIG. 1 for the sake of clarity.

Substrate 102 can be a semiconductor material such as, but not limited to, silicon. In some embodiments, substrate 102 includes a crystalline silicon substrate (e.g., wafer). In some embodiments, substrate 102 includes (i) an elementary semiconductor, such as germanium; (ii) a compound semiconductor including silicon carbide, gallium arsenide, gallium phosphide, indium phosphide, indium arsenide, and/or indium antimonide; (iii) an alloy semiconductor including silicon germanium carbide, silicon germanium, gallium arsenic phosphide, gallium indium phosphide, gallium indium arsenide, gallium indium arsenic phosphide, aluminum indium arsenide, and/or aluminum gallium arsenide; or (iv) a combination thereof. Further, substrate 102 can be doped depending on design requirements (e.g., p-type substrate or n-type substrate). In some embodiments, substrate 102 can be doped with p-type dopants (e.g., boron, indium, aluminum, or gallium) or n-type dopants (e.g., phosphorus or arsenic).

Fin structure 104 represents current-carrying structures of finFET 100 and can traverse along a Y-axis and through gate structures 108. Fin structure 104 can include: (i) fin regions underlying gate structures 108; and (ii) S/D regions 107 disposed on opposing sides of each of gate structures 108. Fin regions of fin structure 104 can extend above STI regions 112 and can be wrapped around by corresponding one of gate structures 108. Fin regions can be formed from patterned portions of substrate 102.

Fin regions of fin structure 104 can include material similar to substrate 102. S/D regions 107 can include an epitaxially-grown semiconductor material. In some embodiments, the epitaxially-grown semiconductor material is the same material as substrate 102. In some embodiments, the epitaxially-grown semiconductor material includes a different material from substrate 102. The epitaxially-grown semiconductor material can include: (i) a semiconductor material, such as germanium or silicon; (ii) a compound semiconductor material, such as gallium arsenide and/or aluminum gallium arsenide; or (iii) a semiconductor alloy, such as silicon germanium and/or gallium arsenide phosphide. Other materials for fin structure 104 are within the scope of this disclosure.

In some embodiments, S/D regions 107 can be grown on fin regions (e.g., fin regions 221 shown in FIG. 2) by (i) chemical vapor deposition (CVD), such as by low pressure CVD (LPCVD), atomic layer CVD (ALCVD), ultrahigh vacuum CVD (UHVCVD), reduced pressure CVD (RPCVD), or a suitable CVD; (ii) molecular beam epitaxy (MBE) processes; (iii) a suitable epitaxial process; or (iv) a combination thereof. In some embodiments, S/D regions 107 can be grown by an epitaxial deposition/partial etch process, which repeats the epitaxial deposition/partial etch process at least once. Such repeated deposition/partial etch process is also called a "cyclic deposition-etch (CDE) process." In some embodiments, S/D regions 107 can be grown by selective epitaxial growth (SEG), where an etching gas is added to promote the selective growth of semiconductor material on the exposed surfaces of fin structures, but not on insulating material (e.g., dielectric material of STI regions 112). Other methods for epitaxially growing S/D regions 107 are within the scope of this disclosure.

S/D regions 107 can be p-type regions or n-type regions. In some embodiments, p-type S/D regions 107 can include SiGe and can be in-situ doped during an epitaxial growth process using p-type dopants, such as boron, indium, or gallium. For p-type in-situ doping, p-type doping precursors such as, but not limited to, diborane ($B_2H_6$), boron trifluoride ($BF_3$), and/or other p-type doping precursors can be used. In some embodiments, n-type S/D regions 107 can include Si and can be in-situ doped during an epitaxial growth process using n-type dopants, such as phosphorus or arsenic. For n-type in-situ doping, n-type doping precursors such as, but not limited to, phosphine ($PH_3$), arsine ($AsH_3$), and/or other n-type doping precursor can be used. In some embodiments, S/D regions 107 are not in-situ doped, and an ion implantation process is performed to dope S/D regions 107.

Each of gate structures 108 can include a gate electrode 116, a dielectric layer 118 adjacent to and in contact with gate electrode 116, and a gate capping layer 120. Gate structures 108 can be formed by a gate replacement process.

In some embodiments, dielectric layer 118 can have a thickness 118$t$ in a range of about 1 nm to about 5 nm. Dielectric layer 118 can include silicon oxide and can be formed by CVD, atomic layer deposition (ALD), physical vapor deposition (PVD), e-beam evaporation, or other suitable processes. In some embodiments, dielectric layer 118 can include (i) a layer of silicon oxide, silicon nitride, and/or silicon oxynitride, (ii) a high-k dielectric material, such as hafnium oxide ($HfO_2$), $TiO_2$, HfZrO, $Ta_2O_3$, $HfSiO_4$, $ZrO_2$, $ZrSiO_2$, (iii) a high-k dielectric material having oxides of Li, Be, Mg, Ca, Sr, Sc, Y, Zr, Al, La, Ce, Pr, Nd, Sm, Eu, Gd, Tb, Dy, Ho, Er, Tm, Yb, or Lu, or (iv) a combination thereof. High-k dielectric layers can be formed by ALD and/or other suitable methods. In some embodiments, dielectric layer 118 can include a single layer or a stack of insulating material layers. Other materials and formation methods for dielectric layer 118 are within the scope of this disclosure.

Gate electrode 116 can include a gate work function metal layer 122 and a gate metal fill layer 124. In some embodiments, gate work function metal layer 122 can be disposed on dielectric layer 118. Gate work function metal layer 122 can include a single metal layer or a stack of metal layers. The stack of metal layers can include metals having work functions similar to or different from each other. In some embodiments, gate work function metal layer 122 can include, for example, aluminum (Al), copper (Cu), tungsten (W), titanium (Ti), tantalum (Ta), titanium nitride (TiN), tantalum nitride (TaN), nickel silicide (NiSi), cobalt silicide (CoSi), silver (Ag), tantalum carbide (TaC), tantalum silicon nitride (TaSiN), tantalum carbon nitride (TaCN), titanium aluminum (TiAl), titanium aluminum nitride (TiAlN), tungsten nitride (WN), metal alloys, and/or combinations thereof. Gate work function metal layer 122 can be formed using a suitable process such as ALD, CVD, PVD, plating, or combinations thereof. In some embodiments, gate work function metal layer 122 has a thickness 122$t$ in a range from about 2 nm to about 15 nm. Other materials, formation methods, and thicknesses for gate work function metal layer 122 are within the scope of this disclosure.

Gate metal fill layer 124 can include a single metal layer or a stack of metal layers. The stack of metal layers can include metals different from each other. In some embodiments, gate metal fill layer 124 can include a suitable conductive material, such as Ti, Ag, Al, TiAlN, TaC, TaCN, TaSiN, Mn, Zr, TiN, TaN, Ru, Mo, WN, Cu, W, Co, Ni, TiC, TiAlC, TaAlC, metal alloys, and/or combinations thereof. Gate metal fill layer 124 can be formed by ALD, PVD, CVD, or other suitable deposition process. Other materials and formation methods for gate metal fill layer 124 are within the scope of this disclosure.

In some embodiments, gate capping layer 120 can have a thickness 120$t$ in a range from about 5 nm to about 50 nm and can be configured to protect gate structure 108 during subsequent processing of finFET 100. Gate capping layer 120 can include nitride material, such as silicon nitride, silicon-rich nitride, and/or silicon oxynitride. Other materials for gate capping layer 120 are within the scope of this disclosure.

Spacers 110 can include spacer portions 110$a$ that form sidewalls of gate structure 108 and are in contact with dielectric layer 118, spacer portions 110$b$ that form sidewalls of fin structure 104, and spacer portions 110$c$ that form protective layers on STI regions 112. Spacers 110 can include insulating material, such as silicon oxide, silicon nitride, a low-k material, or a combination thereof. Spacers 110 can have a low-k material with a dielectric constant less than 3.9 (e.g., less than 3.5, 3, or 2.8). In some embodiments, each of spacers 110 can have a thickness 110$t$ in a range from about 7 nm to about 10 nm. Other materials and thicknesses for spacers 110 are within the scope of this disclosure.

STI regions 112 can provide electrical isolation to finFET 100 from neighboring active and passive elements (not illustrated herein) integrated with or deposited onto substrate 102. STI regions 112 can have a dielectric material, such as silicon oxide, silicon nitride, silicon oxynitride, fluorine-doped silicate glass (FSG), a low-k dielectric material, and/or other suitable insulating material. In some embodiments, STI regions 112 can include a multi-layered structure. The cross-sectional shapes of fin structure 104, S/D regions 107, gate structures 108, spacers 110, and STI regions 112 are illustrative and are not intended to be limiting.

Figure 2:
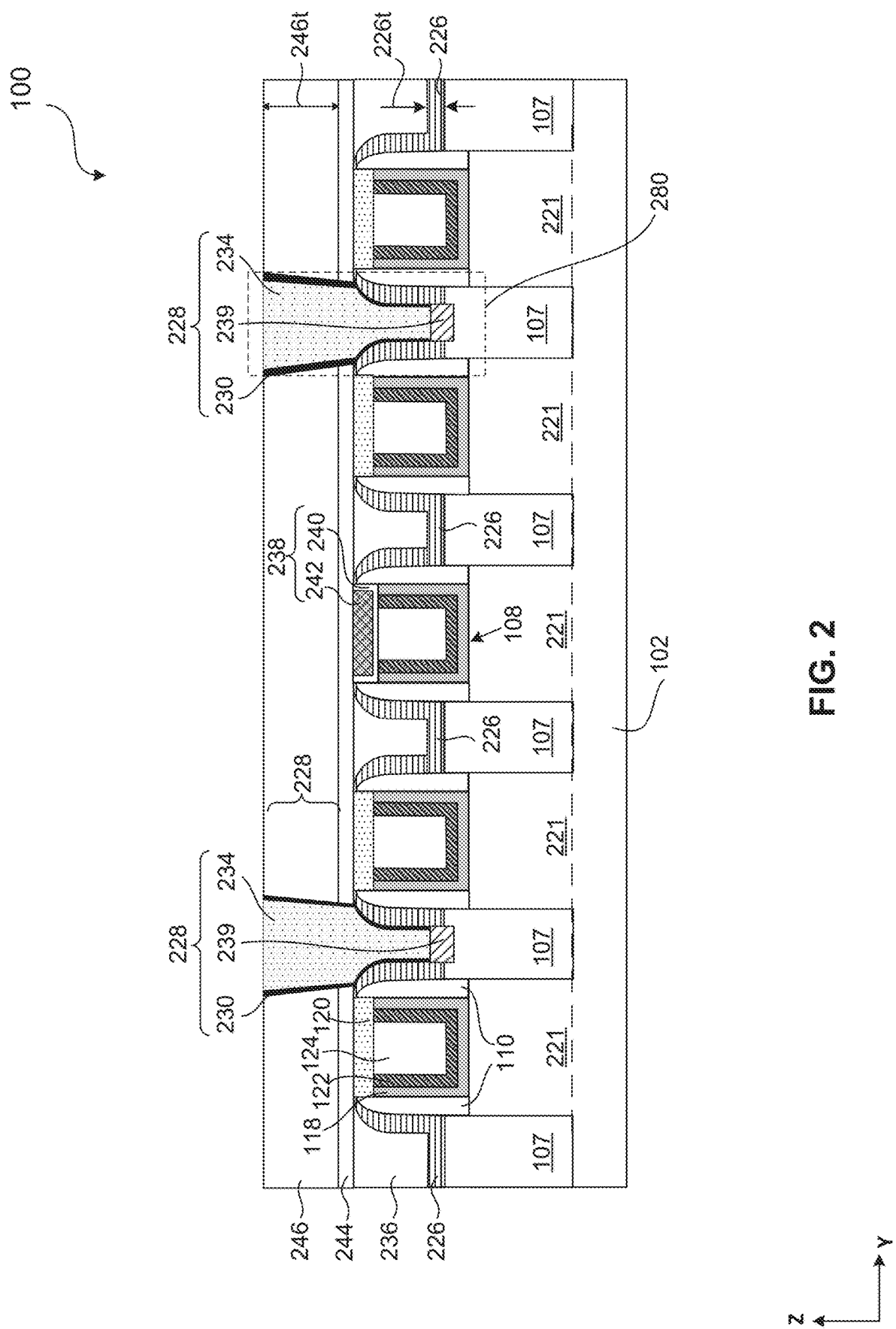
FIG. 2 illustrates a cross-sectional view of a finFET, in accordance with some embodiments.

FIG. 2 is a cross-sectional view along line A-A of finFET 100 of FIG. 1, according to some embodiments. FIG. 2 describes additional structures of finFET 100 (e.g., first and second etch stop layers (ESLs) 226 and 244, first and second interlayer dielectric (ILD) layers 236 and 246, S/D contact structures 228, and a gate contact structure 238 that can electrically connect finFET 100 to other elements of an integrated circuit (not shown) including finFET 100, according to some embodiments. The view of finFET 100 in FIG. 2 is shown for illustration purposes and may not be drawn to scale.

ESL 226 can be configured to protect S/D regions 107 and/or gate structures 108, for example, during the formation of S/D contact structures 228. ESL 226 can be disposed on sides of spacers 110 and on S/D regions 107. In some embodiments, ESL 226 can include, for example, SiNx, SiOx, SiON, SiC, SiCN, BN, SiBN, SiCBN, or a combination thereof. In some embodiments, ESL 226 can include silicon nitride or silicon oxide formed by low pressure chemical vapor deposition (LPCVD), plasma enhanced chemical vapor deposition (PECVD), chemical vapor deposition (CVD), or silicon oxide formed by a high-aspect-ratio process (HARP). In some embodiments, ESL 226 has a thickness 226t in a range from about 20 nm to about 200 nm or from about 20 nm to about 100 nm. Other materials, formation methods, and thicknesses for ESL 226 are within the scope of this disclosure.

ILD layer 236 can be disposed on ESL 226 and can include a dielectric material.

The dielectric material of ILD layer 236 can be deposited using a deposition method suitable for flowable dielectric materials (e.g., flowable silicon oxide, flowable silicon nitride, flowable silicon oxynitride, flowable silicon carbide, or flowable silicon oxycarbide). For example, flowable silicon oxide can be deposited for ILD layer 236 using flowable CVD (FCVD). In an embodiment, the dielectric material is silicon oxide. Other materials and formation methods for ILD layer 236 are within the scope of this disclosure.

S/D contact structures 228 can be configured to electrically connect S/D regions 107 to other elements of finFET 100 and/or of the integrated circuit. S/D contact structures 228 can be disposed on and in contact with top surfaces of S/D regions 107. In some embodiments, each of S/D contact structures 228 can include a metal silicide liner 230 disposed on sidewalls of ESLs 226 and 244 and ILD layer 246, a S/D contact plug 234, and a metal silicide layer 239. Though FIG. 2 shows two S/D contact structures 228, finFET 100 can one or more S/D contact structures 234. The discussion below of S/D contact structure 234 within finFET region 280 of finFET 100 applies to both S/D contact structures 234 of FIG. 2.

In some embodiments, metal silicide liner 230 can be configured as a diffusion barrier layer to prevent diffusion of unwanted atoms and/or ions into S/D contact plug 234 from ILD layer 246 and/or ESLs 226 and 244. In some embodiments, metal silicide liner 230 can include a silicide material, such as titanium silicide (TiSi), titanium silicon oxide (TiSiO), titanium silicon nitride (TiSiN), or a combination thereof. Metal silicide liner 230 can have a thickness in a range from about 0.5 nm to about 2 nm, according to some embodiments.

In some embodiments, S/D contact plug 234 can include a conductive material, such as tungsten (W), ruthenium (Ru), cobalt (Co), nickel (Ni), molybdenum (Mo), copper (Cu), aluminum (Al), rhodium (Rh), iridium (Ir), or metal alloys. In some embodiments, S/D contact plug 234 can have an average horizontal dimension (e.g., width) along a Y-axis in a range from about 15 nm to about 25 nm and can have an average vertical dimension (e.g., height) along a Z-axis in a range from about 400 nm to about 600 nm. In some embodiments, S/D contact plug 234 can have a diameter along a Y-axis ranging from about 20 nm to about 40 nm. Other materials and dimensions for metal silicide liner 230 and S/D contact plug 234 are within the scope of this disclosure.

Metal silicide layer 239 can be formed at interface between S/D contact plug 234 and S/D regions 107. In some embodiments, metal silicide layer 239 can be formed by a self-aligned silicide (salicide) process. A salicide process involves deposition of, for example, a transition metal to form a thin layer by a suitable process such as CVD, application of heat to allow the transition metal to sinter with exposed material in the active regions (source and drain), for example, S/D regions 107, to form a low-resistance transition metal silicide. Transition metals can include Ni, Co, W, tantalum (Ta), Ti, platinum (Pt), erbium (Er), palladium (Pd), or combinations thereof.

In some embodiments, metal silicide layer 239 can be formed by a cyclic process. The cyclic process can include (a) performing a thermal treatment process with a silicon precursor (also referred to as a Si precursor treatment process), (b) performing a plasma treatment process with a metal precursor (also referred to as a metal precursor treatment process), and (c) repeating operations (a) and (b) until a desired thickness is achieved. Metal silicide layer 239 can include silicide materials, such as nickel silicide (NiSi, $NiSi_2$), nickel-platinum silicide (NiPtSi), nickel-platinum-germanium silicide (NiPtGeSi), nickel-germanium silicide (NiGeSi), ytterbium silicide (YbSi), platinum silicide (PtSi), erbium silicide (ErSi), cobalt silicide ($CoSi_2$), titanium silicide ($TiSi_2$), tantalum silicide ($TaSi_2$), other suitable silicide materials, and/or combinations thereof. Any remaining transition metal can be removed by chemical etching, leaving silicide layers only in on S/D regions 107. The structure of S/D contact structure 228 with metal silicide layer 239, metal silicide liner 230, and S/D contact plug 234 on S/D region 107 will be further discussed with reference to FIGS. 3-4 and 5A-5B.

Gate contact structures 238 can be configured to electrically connect gate structure 108 to other elements of finFET 100 and/or of the integrated circuit. Gate contact structure 238 can be disposed on and in contact with dielectric layer 118, gate work function metal layer 122, and gate metal fill layer 124 of gate structure 108. Gate contact structure 238 can include a conductive liner 240 and a gate contact plug 242, which can be similar in composition to metal silicide liner 230 and S/D contact plug 234, respectively. Gate contact structure 238 can be formed on other gate structures (e.g., on gate structures 108) of finFET 100. In some embodiments, gate structures 108 are not connected to conductive structures, such as gate contact structure 238 and can be electrically insulated from other elements of finFET 100 and/or of the integrated circuit.

FinFET 100 can further include a second ESL 244 and a second ILD layer 246. ESL 244 can be optional and can be similar in composition and thickness to ESL 226, according to some embodiments. In some embodiments, ESL 244 can have a thickness in a range from about 5 nm to about 10 nm. ESL 244 can be disposed on ILD layer 236 and gate structures 108. ILD layer 246 can be disposed on ESL 244 and can have a thickness 246t in a range from about 500 nm to about 600 nm. In some embodiments, ILD layer 246 can include a dielectric material, such as silicon oxycarbide, TEOS oxide, or a combination thereof.

FIGS. 3-4 and 5A-5B illustrate enlarged views of finFET region 280 of finFET 100 in FIG. 2, in accordance with some embodiments. More specifically, FIGS. 3-4 and 5A-5B illustrate S/D contact structure 228 (as shown in FIG. 2) with metal silicide liner 230, S/D contact plug 234, and metal silicide layer 239 on S/D region 107 (as shown in FIG. 2), according to various embodiments. Portions of ESLs 226 and 244, ILD 246, and spacers 110 within finFET region 280 of FIG. 1 are not shown in FIGS. 3-4 and 5A-5B for the sake of clarity. The views of S/D contact structure 228 in FIGS. 3-4 and 5A-5B are shown for illustration purposes and may not be drawn to scale. The discussion of elements in FIGS. 3-4 and 5A-5B with the same annotations applies to each other, unless mentioned otherwise.

Figure 3:
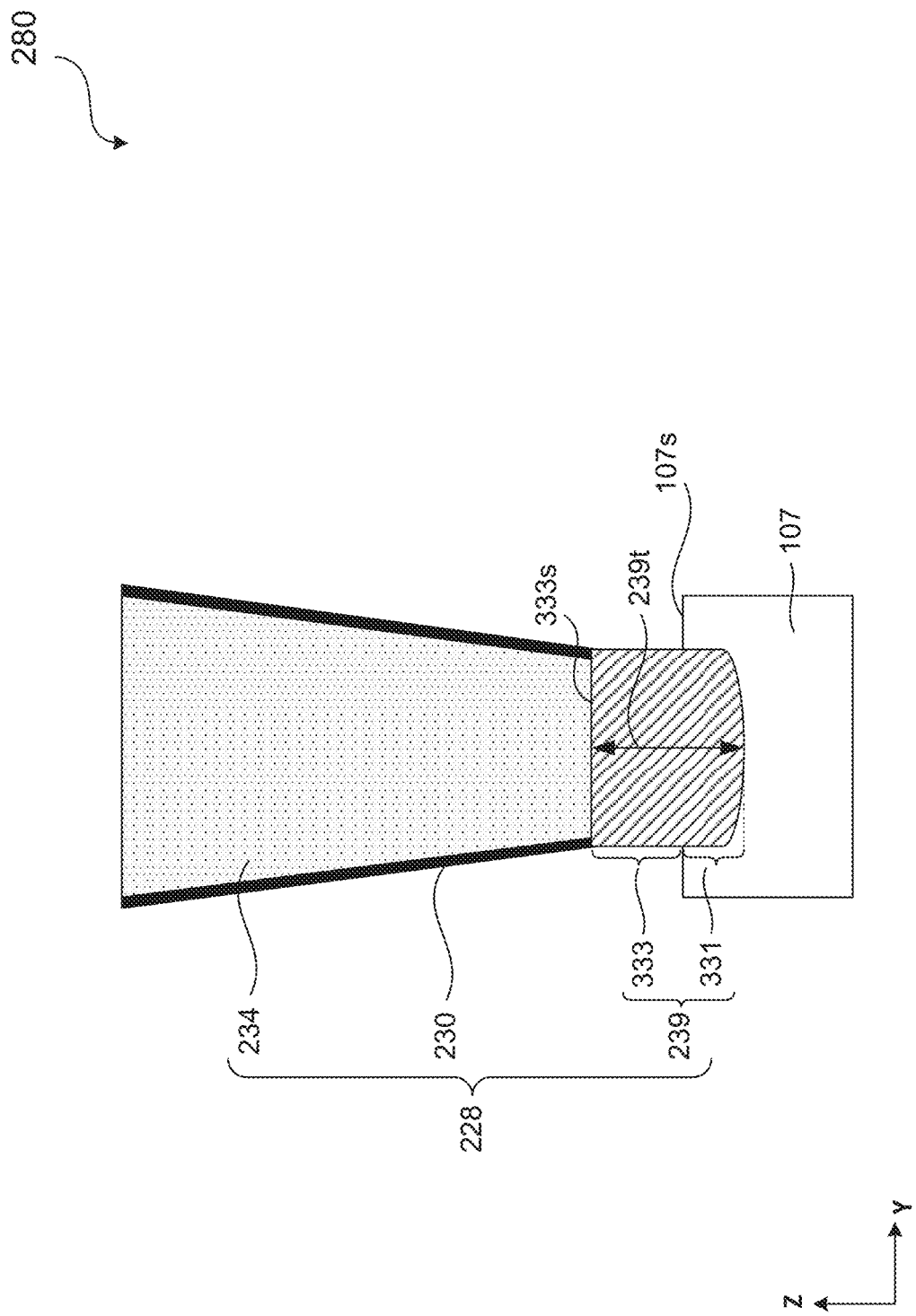

Referring to FIG. 3, metal silicide layer 239 can be disposed on S/D region 107 to wrap around or partially cover portions of S/D region 107. In some embodiments, metal silicide layer 239 can have a thickness 239t ranging from about 1 nm to about 10 nm. Metal silicide layer 239 can provide a low resistance interface between S/D region 107 and S/D contact plug 234. In some embodiments, metal silicide layer 239 can include a metal-rich silicide layer 331 within S/D region 107 and a Si-rich metal silicide layer 333 on metal-rich silicide layer 331. Si-rich metal silicide layer 333 can be extend above top surface 107s of S/D region 107. In some embodiments, the vertical dimension (e.g., thickness) of metal-rich metal silicide layer 331 along a Z-axis can range from about 1 nm to about 3 nm. In some embodiments, the vertical dimension (e.g., thickness) of Si-rich metal silicide layer 333 along a Z-axis can range from about 2 nm to about 10 nm. The vertical dimension of Si-rich metal silicide layer 333 can be greater than the vertical dimension of metal-rich metal silicide layer 331. The portion of metal silicide layer 239 within S/D region 107 (i.e., metal-rich metal silicide layer 331) can be formed thinner than the portion of metal silicide layer 239 above S/D region 107 (i.e., Si-rich metal silicide layer 333) to reduce silicon consumption from S/D region during the formation of metal-rich metal silicide layer 331.

In some embodiments, the horizontal dimensions of metal-rich metal silicide layer 331 and Si-rich metal silicide layer 333 along a Y-axis can be equal to each other as shown in FIG. 3. In some embodiments, the horizontal dimension of metal-rich metal silicide layer 331 can be greater than the horizontal dimension of Si-rich metal silicide layer 333 as shown in FIG. 4. In some embodiments, the metal-rich metal silicide layer 331 can be formed with the horizontal dimension greater than the horizontal dimension of Si-rich metal silicide layer 333 to form a larger interface area between metal silicide layer 239 and S/D region 107 to reduce the contact resistance between S/D contact structure 228 and S/D region 107. The ratio of the horizontal dimension of metal-rich metal silicide layer 331 to the horizontal dimension of Si-rich metal silicide layer 333 can be about 1.1:1 to about 5:1 (e.g., about 1.1:1, about 2:1, about 2.5:1, about 3:1, about 4:1, or about 5:1).

Referring back to FIG. 3, metal-rich silicide layer 331 can be formed within S/D region 107 because the formation of metal-rich silicide layer 331 can include consumption of silicon from some portions of S/D region 107 during the formation of metal silicide layer 239. The silicon can be consumed during a silicidation reaction between the metal deposited (e.g., Ti-comprising layer) on S/D region 107 and the silicon from S/D region 107. Si-rich metal silicide layer 333 can be formed above top surface 107s because the formation of Si-rich silicide layer 333 can include a silicidation reaction between the metal deposited on S/D region 107 and a Si precursor gas supplied during the formation of metal silicide layer 239. There is substantially no consumption of silicon from S/D region 107 during the formation of Si-rich metal silicide layer 333. Such method for forming metal silicide layer 239

In some embodiments, the formation of metal-rich metal silicide layer 331 can include a metal deposition process and a thermal annealing process. In some embodiments, metal-rich metal silicide layer 331 can be formed from a salicide process between S/D region 107 and a metal layer (e.g., a layer of Ti-comprising material) deposited on S/D region 107. The deposited metal layer can react with a heavily doped Si-comprising region of S/D region 107 during the thermal annealing process to form metal-rich metal silicide layer 331. During the formation of metal silicide layer 331, Si-comprising region of S/D regions 107 can be partially consumed. In some embodiments, prior to the metal deposition, native oxide from top surface 107s can be etched using HF and $NH_3$ gases at a flow rate between about 1 sccm to about 50 sccm. During etching, a pressure and temperature in an etching chamber can be maintained in the range from about 0.1 Torr to about 0.5 Torr and from about 20° C. to about 80° C., respectively. The etching can be followed by an in-situ heat treatment with $N_2$ gas flowing at a rate of about 1 slm to about 5 slm and a pressure and temperature in the etching chamber maintained in the range from about 0.1 Torr to about 1 Torr and from about 150° C. to about 200° C., respectively. The metal deposition can be performed using any suitable deposition process, such as CVD, PECVD, or ALD.

In some embodiments, the metal deposition process can include depositing a Ti-comprising layer using a Ti precursor (e.g., $TiCl_4$, tetrakis(dimethylamino)titanium (TDMAT), or trillium Ti) as a plasma gas in a PECVD process. In some embodiments, Ti precursor flow rate can range from about 10 mgm to about 100 mgm. The pressure and temperature in a CVD chamber during the metal deposition can be maintained in a range from about 1 Torr to about 50 Torr and from about 350° C. to about 450° C., respectively. In some embodiments, the metal deposition process with the Ti precursor can be carried out for a time period of about 30 seconds to about 90 seconds or about 60 seconds.

In some embodiments, the metal deposition process can include depositing a Ti-comprising layer using a Ti precursor gas (e.g., $TiCl_4$) and $H_2$ plasma gas in a CVD process. The Ti precursor gas can have a flow rate ranging from about 10 sccm to about 200 sccm and $H_2$ gas can have a flow rate ranging from about 10 sccm to about 100 sccm. The pressure and temperature in a CVD chamber during the metal deposition process can be maintained in a range from about 1 Torr to about 10 Torr and from about 300° C. to about 600° C., respectively. In some embodiments, the metal deposition process with the Ti precursor and $H_2$ plasma gas can be carried out for a time period of about 30 seconds to about 90 seconds or about 60 seconds.

In some embodiments, the thermal annealing process can be performed in-situ during the metal deposition process at a temperature ranging from about 300° C. to about 600° C. In some embodiments, the metal deposition process can be followed by the thermal annealing process. The thermal annealing process can include rapid thermal annealing (RTA) process. The deposited metal layer (e.g., Ti-comprising layer) can be subjected to the thermal annealing process at a temperature ranging from about 300° C. to about 600° C. for a time period ranging from about 10 seconds to about 60 seconds. The thermal annealing process can be carried out in a $N_2$ ambient. The silicidation reaction between the deposited metal layer and silicon of S/D region 107 can occur during the thermal annealing process.

In some embodiments, the formation of Si-rich metal silicide layer 333 can include a cyclic process with the following operations: (a) performing a thermal treatment with a silicon precursor (also referred to as a Si precursor treatment process); and (b) performing a plasma treatment process with a metal precursor (also referred to as a metal precursor treatment process). A silicon-comprising layer can be deposited during the Si precursor treatment process and a metal-comprising layer can be deposited during the metal precursor treatment process and a silicidation reaction between the silicon-comprising layer and the metal-comprising layer can form Si-rich metal silicide layer 333. In some embodiments, the Si precursor treatment process can include performing a soaking process at a temperature ranging from about 300° C. to about 450° C. using a silicon precursor that includes silane ($SiH_4$), disilane, trisilane, tetrasilane, pentasilane, chlorosilane, dichlorosilane, trichlorosilane, tetrachlorosilane, iodosilane, tribromosilane, silicic acid, tetraiodosilane, tetrabromosilane, tetrafluorosilane, chlorotrifluorosilane, dichlorodifluorosilane, trichlorofluorosilane, or a combination thereof.

In some embodiments, the cyclic process can include (a) contacting S/D region 107 with a vaporized silicon precursor including a silane, for example disilane or trisilane, in a first chamber during the Si precursor treatment process; (b) contacting S/D region 107 with a vaporized metal precursor including a metal halide, for example a Ta, Nb, or Ti halide during the metal precursor treatment process; and (c) optionally repeating operations (a) and (b) until a desired thickness for Si-rich metal silicide layer 333 has been formed. In some embodiments, the vaporized silicon precursor can include silane, disilane, trisilane, tetrasilane, pentasilane, chlorosilane, dichlorosilane, trichlorosilane, tetrachlorosilane, iodosilane, tribromosilane, silicic acid, tetraiodosilane, tetrabromosilane, tetrafluorosilane, chlorotrifluorosilane, dichlorodifluorosilane, trichlorofluorosilane, or a combination thereof. In some embodiments, the metal precursor can include a metal halide. In some embodiments, the metal halide can include a halogen atom such as, F, Cl, Br, or a combination thereof. In some embodiments, the metal halide can include a metal atom such as, Co, Ni, Ti, W, Mo, Ta, Nb, other refractory metals, or a combination thereof. In some embodiments, the metal halide can include $TiCl_4$, $TiF_3$, $TiBr_3$, $TiCl_3$, $TaF_5$, $TaCl_5$, $NbF_5$, and/or $NbCl_5$.

In some embodiments, the Si precursor treatment process (operation (a)) can be carried out for a time period ranging from about 0.5 seconds to about 10 seconds (e.g., about 1 second, about 3 seconds, about 8 seconds, or about 10 seconds). In some embodiments, the metal precursor treatment process (operation (b)) can be carried out for a time period ranging from about 30 seconds to about 90 seconds (e.g., about 30 seconds, about 60 seconds, or about 90 seconds). Depending on substrate type and substrate surface area, the duration for operations (a) and (b) can be higher or lower.

In some embodiments, the metal precursor treatment process can include depositing a metal-comprising layer (e.g., Ti-comprising layer) using the metal precursor gas (e.g., $TiCl_4$) and $H_2$ plasma gas in a CVD process. The metal precursor treatment process can be performed in the same CVD chamber as the deposition of metal silicide layer 331. In some embodiments, during the metal precursor treatment process, the flow rate of the metal precursor can range from about 10 mgm to about 100 mgm. The pressure and temperature during the metal precursor treatment process can be maintained in a range from about 1 Torr to about 50 Torr and from about 300° C. to about 450° C., respectively. The pressure and temperature during the Si precursor treatment process can be maintained in a range from about 1 Torr to about 50 Torr and from about 300° C. to about 450° C., respectively.

In some embodiments, operations (a) and (b) of the cyclic process can be repeated for about 100 cycles, about 50 cycles, about 20 cycles, about 10 cycles, about 5 cycles, 2 cycles, or 1 cycle until a desired thickness of Si-rich metal silicide layer 333 can be formed. In some embodiments, Si-rich metal silicide layer 333 can have a vertical dimension (e.g., thickness) along a Z-axis ranging from about 2 nm to about 10 nm, from about 4 nm to about 10 nm, or from about 4 nm to about 7 nm. In some embodiments, the vertical dimension of Si-rich metal silicide layer along a Z-axis can be about 90%, about 80%, about 70%, about 60%, or about 50% of the total thickness 239t of metal silicide layer 239.

Figure 5B:
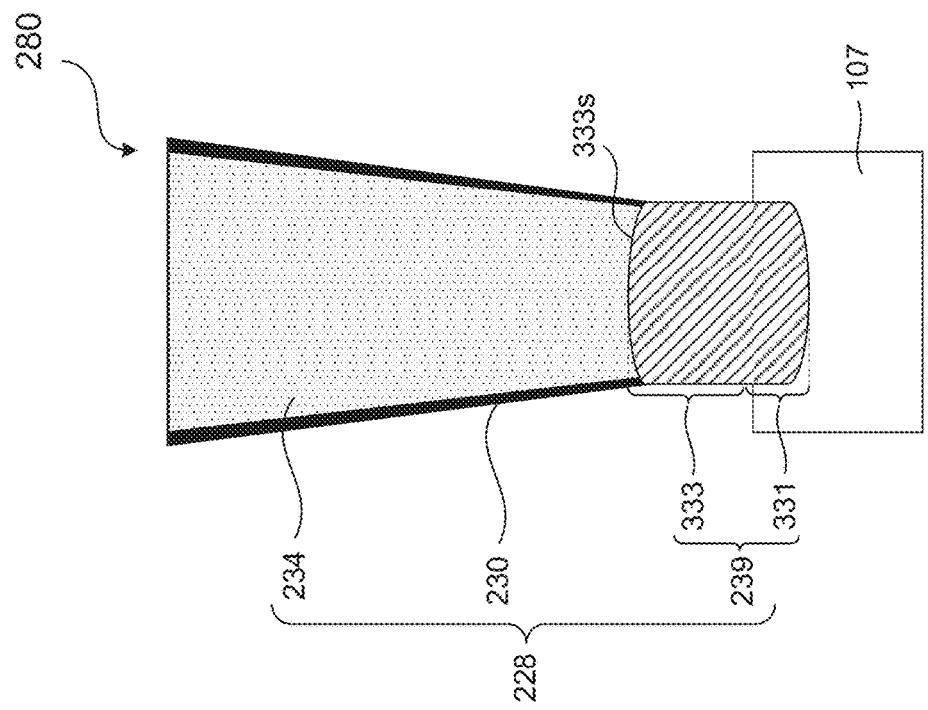
Figure 5A:
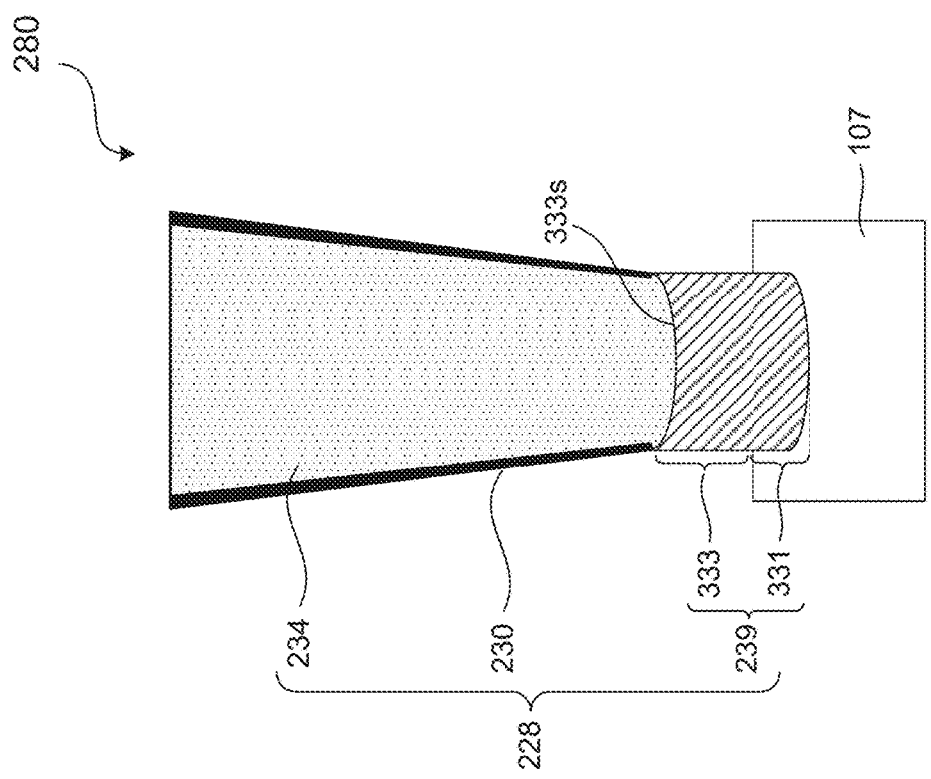

In some embodiments, top surface 333s of Si-rich metal silicide layer 333 can be substantially planar as shown in FIG. 3 when the rate of silicidation reaction between the silicon-comprising layer and the metal-comprising layer is substantially equal to the deposition rates of the silicon-comprising layer and/or the metal-comprising layer. In some embodiments, top surface 333s of Si-rich metal silicide layer 333 can be concave or convex shaped as shown in FIGS. 5A-5B, respectively, when the rate of silicidation reaction between the silicon-comprising layer and the metal-comprising layer is greater or smaller, respectively, than the deposition rates of the silicon-comprising layer and/or the metal-comprising layer. The deposition rates of the silicon-comprising layer and/or the metal-comprising layer can be adjusted by adjusting the process parameters of the Si precursor treatment process and the metal precursor treatment process, respectively, to form concave or convex shaped top surface 333s. Such concave or convex shaped top surface 333s can increase the contact surface area between S/D contact plug 234 and metal silicide layer 239 and as a result, reduce the contact resistance between S/D contact plug 234 and metal silicide layer 239.

Referring back to FIG. 3, by alternating the deposition of silicon-comprising layer during the Si precursor treatment process and metal-comprising layer during the metal precursor treatment process for the deposition of metal silicide layer 239, consumption of epitaxially grown silicon region in S/D region 107 can be reduced and the Kirkendall effect can also be reduced to improve phase stability of S/D contact. The Kirkendall effect refers to the motion of the interface between two metals that occurs as a consequence of the difference in diffusion rates of the metal atoms. The Kirkendall effect can generate Si vacancies in S/D region 107 through metal silicide formation when the metal-comprising layer is deposited and reacts with the epitaxial silicon layer to form metal silicide, which can worsen dopant redistribution and dopant loss at the interface between metal silicide layer 239 and S/D region 107. The method to supply the silicon precursor during the formation of Si-rich metal silicide layer 333 can reduce the Kirkendall effect and improve dopant redistribution in S/D region 107. In some embodiments, the epitaxial layer in S/D region 107 after formation of metal silicide layer 239 can have a thickness of at least 2.5 nm. In some embodiments, metal-rich metal silicide layer 331 can have an atomic concentration ratio of metal to silicon between about 3:1 and about 1.1:1 or between about 2:1 and about 1.1:1. In some embodiments, Si-rich metal silicide layer 333 can have an atomic concentration ratio of metal to silicon between about 1:1.1 and about 1:2 or between about 1:1.1 and about 1:1.5.

Referring to FIG. 3, metal silicide liner 230 can be formed along sidewalls of ESLs 226 and 244 and ILD layer 246 (not shown in FIG. 3; shown in FIG. 2) during the formation of Si-rich metal silicide layer 333 in the cyclic process including the Si precursor treatment process and the metal precursor treatment process. Metal silicide liner 230 can include a silicide material, such as TiSi, TiSiO, TiSiN, or a combination thereof. The thickness of metal silicide liner 230 along a Y-axis can be smaller than the thickness of Si-rich metal silicide layer 333 along a Z-axis because the metal-comprising layer formed during the metal precursor treatment process can have a lower deposition selectivity for an oxide- or nitride-comprising surface (e.g., sidewalls of ESLs 226 and 244 and/or ILD layer 246) than a substantially oxide or nitride free silicon surface and/or a silicide surface (e.g., metal-rich silicide layer 331 or Si-rich metal silicide layer 333). The deposition selectivity of the metal-comprising layer is further discussed with reference to FIGS. 6A-6B. In some embodiments, the deposition selectivity of the metal-comprising layer to the oxide- or nitride-comprising surface over the substantially oxide or nitride free silicon surface and/or a silicide surface can be about 1:2 to about 1:10 (e.g., about 1:2, about 1:2.5, about 1:3, about 1:3.7, about 1:4, about 1:6, or about 1:10). The ratio of the thickness of metal silicide liner 230 along a Y-axis to the thickness of Si-rich metal silicide layer 333 along a Z-axis can be about 1:2 to about 1:10 (e.g., about 1:2, about 1:2.5, about 1:3, about 1:3.7, about 1:4, about 1:6, or about 1:10).

Following the deposition of metal silicide layers 239, unreacted portions of silicon-comprising layer and/or metal-comprising layer (not shown in FIG. 3) can be selectively etched leaving metal silicide layers 239 on S/D regions 107 as shown in FIG. 3. In some embodiments, the etching process can include using an etching mixture of HCl and $H_2O_2$ or an etching mixture of $H_2SO_4$ and $H_2O_2$ at a temperature in a range from about 20° C. to about 200° C.

Figure 6B:
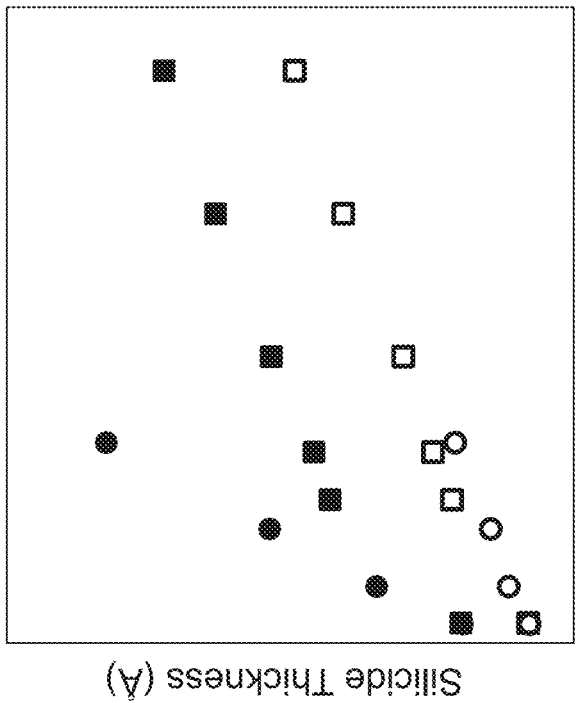
FIGS. 6A-6B illustrate characteristics of deposited silicide layers of a finFET, in accordance with some embodiments.
Figure 6A:
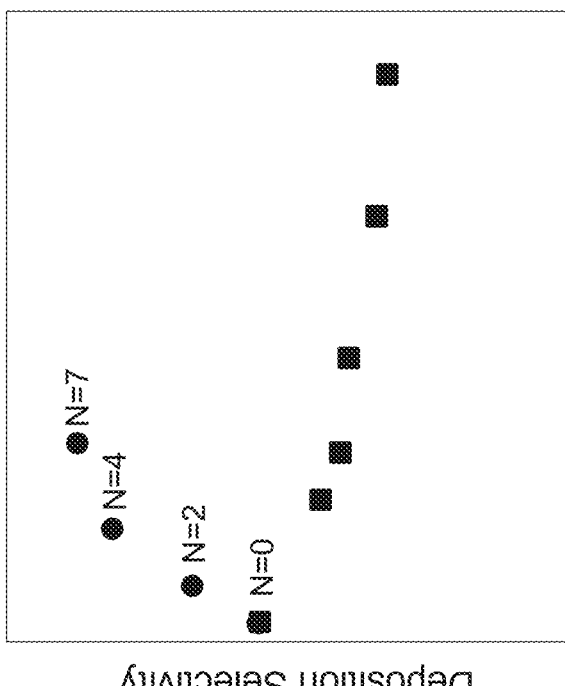

FIG. 6A shows a comparison between the deposition selectivity (black circles) of the metal-comprising layer formed during the cyclic process (described with reference to FIG. 3) including the metal precursor and Si precursor treatment processes and the deposition selectivity (black squares) of a test metal-comprising layer formed in a metal precursor treatment process (similar to that described with reference to FIG. 3) without the Si precursor treatment process in a cyclic process. The deposition selectivities of the metal-comprising layers are compared for a substantially oxide or nitride free silicon surface and/or a silicide surface (e.g., metal-rich silicide layer 331 or Si-rich metal silicide layer 333) relative to an oxide- or nitride-comprising surface (e.g., sidewalls of ESLs 226 and 244 and/or ILD layer 246). The N value in FIG. 6A is the number of cycles of the metal precursor and Si precursor treatment processes. The comparison of FIG. 6A shows that the deposition selectivity is higher for the metal-comprising layer formed in the cyclic process and the higher deposition selectivity can be achieved at a shorter metal precursor deposition time. In some embodiments, the deposition selectivity of the metal-comprising layer formed in the cyclic process can 2 times higher than the deposition selectivity of the test metal-comprising layer for the same deposition time period. In some embodiments, the deposition selectivity of the metal-comprising layer formed in the cyclic process can be increased with increase in the N value. In some embodiments, increasing the N value from 2 to 7, can increase the deposition selectivity of the metal-comprising layer formed in the cyclic process by about 25% to about 35%.

FIG. 6B shows that a silicide layer (e.g., Si-rich metal silicide layer 333; represented by black solid circles) formed in the cyclic process (described with reference to FIG. 3) including the metal precursor and Si precursor treatment processes can have a faster deposition rate that a silicide layer (represented by black solid squares) formed in a metal precursor treatment process (similar to that described with reference to FIG. 3) without the Si precursor treatment process in a cyclic process. FIG. 6B also shows that a silicide layer (e.g., Si-rich metal silicide layer 333) formed in the cyclic process on a substantially oxide or nitride free silicon surface and/or a silicide surface (e.g., metal-rich silicide layer 331 or Si-rich metal silicide layer 333) can have a faster deposition rate that a silicide liner (e.g., metal silicide liner 230; represented by black circles) formed on an oxide- or nitride-comprising surface (e.g., sidewalls of ESLs 226 and 244 and/or ILD layer 246).

Figure 7:
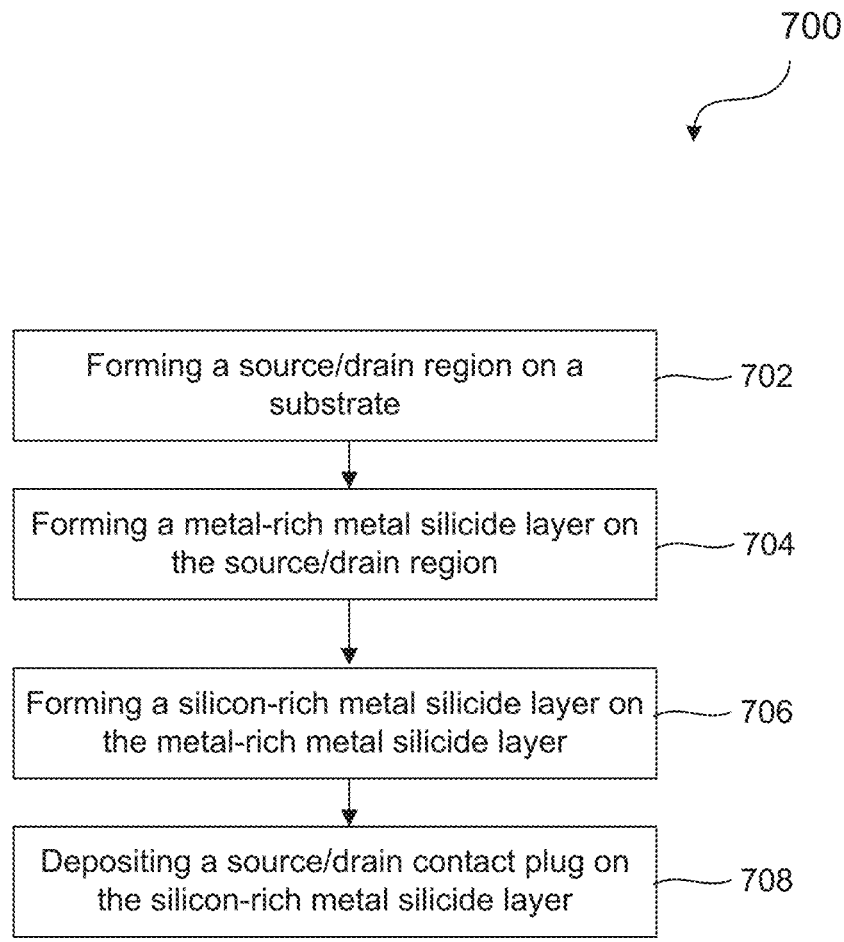
FIG. 7 illustrates a flow diagram of a method for fabricating a finFET with deposited silicide layers, in accordance with some embodiments.

FIG. 7 illustrates flow chart of a method for fabricating finFET 100 with S/D contact structure 228 as described with reference to FIGS. 2-4 and 5A-5B, in accordance with some embodiments. For illustrative purposes, the operations illustrated in FIG. 7 will be described with reference to the example fabrication process illustrated in FIGS. 1-4 and 5A-5B. Operations can be performed in a different order or not performed depending on specific applications. It should be noted that method 700 does not produce a complete finFET 100. Accordingly, it is understood that additional processes can be provided before, during, and after method 700.

In operation 702, a source/drain (S/D) region is formed on a substrate. For example, as shown in FIGS. 1-2, S/D regions 107 can be formed on fin regions 221, which can be formed on substrate 102. The current disclosure can be applied to any other suitable semiconductor devices besides finFET 100. Semiconductor material of S/D regions 107 can be selectively epitaxially-grown over fin regions 221. In some embodiments, the selective epitaxial growth of the semiconductor material of S/D regions 107 can continue until the semiconductor material extends vertically (e.g., along a Z-axis) a distance in a range from about 10 nm to about 100 nm above top surface of substrate 102 and extends laterally (e.g., along an X-axis or a Y-axis) over top surfaces of some of STI regions 112. The epitaxial processes for growing the semiconductor material can include CVD deposition techniques (e.g., LPCVD, vapor-phase epitaxy (VPE), and/or ultra-high vacuum CVD (UHV-CVD)), molecular beam epitaxy, and/or other suitable processes. The semiconductor material can include: (i) a semiconductor material, such as germanium or silicon; (ii) a compound semiconductor material, such as gallium arsenide and/or aluminum gallium arsenide; or (iii) a semiconductor alloy, such as silicon germanium and/or gallium arsenide phosphide. In some embodiments, p-type S/D regions 107 can include SiGe and can be in-situ doped during an epitaxial growth process using p-type dopants, such as boron, indium, or gallium. In some embodiments, n-type S/D regions 107 can include Si and can be in-situ doped during an epitaxial growth process using n-type dopants, such as phosphorus or arsenic.

Referring to FIG. 7, in operation 704, a metal-rich metal silicide layer is deposited on the source/drain region. For example, as shown in FIGS. 3-4 and 5A-5B, metal-rich metal silicide layer 331 can be deposited on S/D regions 107. The deposition of metal-rich metal silicide layer 331 can include the metal deposition process and the thermal annealing process. In some embodiments, metal-rich metal silicide layer 331 can be deposited from a salicide process between S/D region 107 and a metal layer disposed on S/D region 107. The deposited metal layer can react with a heavily doped Si-comprising region of S/D regions 107 during the thermal annealing process to form metal-rich metal silicide layer 331. In some embodiments, prior to metal deposition, native oxide from top surfaces of S/D region 107 can be etched using HF and $NH_3$ gases. Metal deposition can be performed using any suitable deposition process, such as, but not limited to, CVD, PECVD, or ALD. The thermal annealing process can be performed at a temperature between about 300° C. and about 600° C.

In some embodiments, the metal deposition process can include depositing a Ti-comprising layer using a Ti precursor (e.g., $TiCl_4$, tetrakis(dimethylamino)titanium (TDMAT), or trillium Ti) as a plasma gas in a PECVD process. In some embodiments, Ti precursor flow rate can range from about 10 mgm to about 100 mgm. The pressure and temperature in a CVD chamber during the metal deposition can be maintained in a range from about 1 Torr to about 50 Torr and from about 350° C. to about 450° C., respectively. In some embodiments, the metal deposition process with the Ti precursor can be carried out for a time period of about 30 seconds to about 90 seconds or about 60 seconds.

In some embodiments, the metal deposition process can include depositing a Ti-comprising layer using a Ti precursor gas (e.g., $TiCl_4$) and $H_2$ plasma gas in a CVD process. The Ti precursor gas can have a flow rate ranging from about 10 sccm to about 200 sccm and $H_2$ gas can have a flow rate ranging from about 10 sccm to about 100 sccm. The pressure and temperature in a CVD chamber during the metal deposition process can be maintained in a range from about 1 Torr to about 10 Torr and from about 300° C. to about 600° C., respectively. In some embodiments, the metal deposition process with the Ti precursor and $H_2$ plasma gas can be carried out for a time period of about 30 seconds to about 90 seconds or about 60 seconds.

In some embodiments, the thermal annealing process can be performed in-situ during the metal deposition process at a temperature ranging from about 300° C. to about 600° C. In some embodiments, the metal deposition process can be followed by the thermal annealing process. The thermal annealing process can include rapid thermal annealing (RTA) process. The deposited metal layer (e.g., Ti-comprising layer) can be subjected to the thermal annealing process at a temperature ranging from about 300° C. to about 600° C. for a time period ranging from about 10 seconds to about 60 seconds. The thermal annealing process can be carried out in a $N_2$ ambient. The silicidation reaction between the deposited metal layer and silicon of S/D region 107 can occur during the thermal annealing process.

In operation 706, a Si-rich metal silicide layer is deposited on the metal-rich metal silicide layer. For example, as shown in FIGS. 3-4 and 5A-5B, Si-rich metal silicide layer 333 can be deposited on metal-rich metal silicide layer 331. The deposition of Si-rich metal silicide layer 333 can include the cyclic process with the following operations: (a) performing the thermal treatment process with a silicon precursor (also referred to as the Si precursor treatment process); (b) performing the plasma treatment process with a metal precursor (also referred to as the metal precursor treatment process); and (c) repeating operations (a) and (b). In some embodiments, the Si precursor treatment process can include performing a soaking process at a temperature ranging from about 300° C. to about 450° C. using a silicon precursor including, but not limited to, silane, disilane, trisilane, tetrasilane, pentasilane, chlorosilane, dichlorosilane, trichlorosilane, tetrachlorosilane, iodosilane, tribromosilane, silicic acid, tetraiodosilane, tetrabromosilane, tetrafluorosilane, chlorotrifluorosilane, dichlorodifluorosilane, trichlorofluorosilane, or a combination thereof.

In some embodiments, the cyclic process can include (a) contacting S/D region 107 with a vaporized silicon precursor in a first chamber during the Si precursor treatment process; (b) contacting S/D region 107 with a vaporized metal precursor during the metal precursor treatment process; and (c) optionally repeating operations (a) and (b) until a desired thickness for Si-rich metal silicide layer 333 has been formed. In some embodiments, the metal halide can include a halogen atom such as, F, Cl, Br, or a combination thereof. In some embodiments, the metal halide can include a metal atom such as, Co, Ni, Ti, W, Mo, Ta, Nb, other refractory metals, or a combination thereof. In some embodiments, the metal halide can include $TiCl_4$, $TiF_3$, $TiBr_3$, $TiCl_3$, $TaF_5$, $TaCl_5$, $NbF_5$, and/or $NbCl_5$.

In some embodiments, the Si precursor treatment process (operation (a)) can be carried out for a time period ranging from about 0.5 seconds to about 10 seconds (e.g., about 1 second, about 3 seconds, about 8 seconds, or about 10 seconds). In some embodiments, the metal precursor treatment process (operation (b)) can be carried out for a time period ranging from about 30 seconds to about 90 seconds (e.g., about 30 seconds, about 60 seconds, or about 90 seconds).

In some embodiments, the metal precursor treatment process can include depositing a metal-comprising layer (e.g., Ti-comprising layer) using the metal precursor gas (e.g., $TiCl_4$) and $H_2$ plasma gas in a CVD process. The metal precursor treatment process can be performed in the same CVD chamber as the deposition of metal silicide layer 331. In some embodiments, during the metal precursor treatment process, the flow rate of the metal precursor can range from about 10 mgm to about 100 mgm. The pressure and temperature during the metal precursor treatment process can be maintained in a range from about 1 Torr to about 50 Torr and from about 300° C. to about 450° C., respectively. The pressure and temperature during the Si precursor treatment process can be maintained in a range from about 1 Torr to about 50 Torr and from about 300° C. to about 450° C., respectively. In some embodiments, operations (a) and (b) of the cyclic process can be repeated for about 100 cycles, about 50 cycles, about 20 cycles, about 10 cycles, about 5 cycles, 2 cycles, or 1 cycle until a desired thickness of Si-rich metal silicide layer 333 can be formed.

Referring to FIG. 7, in operation 708, a S/D contact plug is formed on the Si-rich metal silicide layer. For example, as shown in FIGS. 3-4 and 5A-5B, S/D contact plug 234 can be formed on Si-rich metal silicide layer 333. The deposition of the materials of S/D contact plug 234 can be performed using, for example, PVD, CVD, or ALD. In some embodiments, S/D contact plug 234 can include a conductive material, such as W, Ru, Co. Ni, Mo, Cu, Al, Rh, Ir, or metal alloys. In some embodiments, S/D contact plug 234 can have an average horizontal dimension (e.g., width) in a range from about 15 nm to about 25 nm and can have an average vertical dimension (e.g., height) in a range from about 400 nm to about 600 nm. In some embodiments, prior to the formation of metal-rich metal silicide layer 331, Si-rich metal silicide layer 333, and S/D contact plug 234, a contact opening (not shown) can be formed within ILD layers 236 and 246 and ESLs 226 and 244 (shown in FIG. 2). In some embodiments, the formation of contact openings can include photolithography and etching.

The above embodiments describe S/D contact structures (e.g., S/D contact structures 228) and methods for making the same. The S/D contact structures and methods can reduce contact resistance between S/D region and S/D contact structures of semiconductor devices (e.g., finFET and MOSFETs). Such embodiments provide a deposited Si-rich metal silicide layer (e.g., Si-rich metal silicide layer 333) to reduce Kirkendall effect to improve phase stability of the contact and to reduce silicon consumption of epitaxial S/D regions during the formation of a metal silicide layer. Such reduction and improvement in contact resistance are achieved without an increase in critical dimension (e.g., line widths) of the field effect transistors. Some of the embodiments are described below.

In some embodiments, a method of forming a semiconductor device includes forming a source/drain region on a substrate, forming an etch stop layer (ESL) layer on the source/drain region, depositing a metal-rich metal silicide layer on the source/drain region, simultaneously depositing a silicon-rich metal silicide layer on the metal-rich metal silicide layer and a silicide liner on sidewalls of the ESL, and forming a contact plug on the silicon-rich metal silicide layer.

In some embodiments, a method of forming a semiconductor device includes forming a fin structure on a substrate, forming a source/drain region on the fin structure, forming an interlayer dielectric (ILD) layer on the source/drain region, depositing a metal-rich metal silicide layer on the source/drain region, simultaneously depositing a silicon-rich metal silicide layer on the metal-rich metal silicide layer and a silicide liner on sidewalls of the ILD layer, and forming a contact plug on the silicon-rich metal silicide layer.

In some embodiments, a semiconductor device includes a fin structure on a substrate, a source/drain region on the fin structure, a metal-rich metal silicide layer on the source/drain region, a silicon-rich metal silicide layer on the metal-rich metal silicide layer, and a contact plug on the silicon-rich metal silicide layer.

The foregoing disclosure outlines features of several embodiments so that those skilled in the art can better understand the aspects of the present disclosure. Those skilled in the art should appreciate that they can readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they can make various changes, substitutions, and alterations herein without departing from the spirit and scope of the present disclosure.

What is claimed is:

1. A semiconductor device, comprising:
a fin structure disposed on a substrate;
a source/drain region (S/D) disposed on the fin structure;
a metal-rich silicide layer disposed within the source/drain (S/D) region;
a silicon-rich silicide layer disposed on the metal-rich silicide layer; and
a contact plug disposed on the silicon-rich silicide layer.

2. The semiconductor device of claim 1, wherein the silicon-rich silicide layer vertically extends over a top surface of the S/D region.

3. The semiconductor device of claim 1, wherein the metal-rich silicide layer comprises an atomic concentration ratio of metal to silicon between about 3:1 and about 1:1.

4. The semiconductor device of claim 1, wherein the silicon-rich silicide layer comprises an atomic concentration ratio of metal to silicon between about 1:1 and about 1:2.

5. The semiconductor device of claim 1, wherein a thickness of the silicon-rich silicide layer is greater than a thickness of the metal-rich metal silicide layer.

6. The semiconductor device of claim 1, wherein a thickness of the metal-rich silicide layer is between about 1 nm and about 3 nm.

7. The semiconductor device of claim 1, wherein a thickness of the silicon-rich silicide layer is between about 4 nm and about 10 nm.

8. The semiconductor device of claim 1, further comprising a silicide liner disposed along sidewalls of the contact plug.

9. The semiconductor device of claim 1, further comprising a silicide liner disposed on the silicon-rich silicide layer.

10. The semiconductor device of claim 9, wherein a ratio of a thickness of the silicide liner to a thickness of the silicon-rich silicide layer is between about 1:2 and about 1:10.

11. A semiconductor device, comprising:
a fin structure disposed on a substrate;
a source/drain region (S/D) disposed on the fin structure;
a metal-rich silicide layer disposed within the S/D region;
a silicon-rich metal silicide layer disposed on the metal-rich silicide layer; and
a contact plug disposed on the silicon-rich silicide layer.

12. The semiconductor device of claim 11, wherein a concentration of metal atoms is greater than a concentration of silicon atoms in the metal-rich silicide layer.

13. The semiconductor device of claim 11, wherein a concentration of silicon atoms is greater than a concentration of metal atoms in the silicon-rich metal silicide layer.

14. The semiconductor device of claim 11, wherein the metal-rich silicide layer comprises an atomic concentration ratio of metal to silicon between about 3:1 and about 1:1.

15. The semiconductor device of claim 11, wherein the silicon-rich metal silicide layer comprises an atomic concentration ratio of metal to silicon between about 1:1 and about 1:2.

16. A semiconductor device, comprising:
a fin structure disposed on a substrate;
a source/drain region (S/D) disposed on the fin structure;
a gate structure disposed on the fin structure;
a metal-rich silicide layer disposed within the S/D region;
a contact plug disposed over the metal-rich silicide layer; and
a silicide liner disposed along sidewalls of the contact plug.

17. The semiconductor device of claim 16, wherein a silicon-rich silicide layer is disposed between the metal-rich silicide layer and the contact plug.

18. The semiconductor device of claim 17, wherein a horizontal dimension of the metal-rich silicide layer is greater than a horizontal dimension of the silicon-rich silicide layer.

19. The semiconductor device of claim 17, wherein a ratio of a width of the metal-rich silicide layer to a width of the silicon-rich silicide layer is between about 1:1 and about 5:1.

20. The semiconductor device of claim 17, wherein a ratio of a thickness of the silicide liner to a thickness of the silicon-rich silicide layer is between about 1:2 and about 1:10.

* * * * *